US012733439B2

(12) United States Patent
Park

(10) Patent No.: US 12,733,439 B2
(45) Date of Patent: Sep. 8, 2026

(54) APPARATUS FOR TREATING SUBSTRATE AND METHOD FOR TREATING SUBSTRATE

(71) Applicant: SEMES CO., LTD., Cheonan-si (KR)

(72) Inventor: Chang Jun Park, Pyeongtaek-si (KR)

(73) Assignee: SEMES Co., Ltd., Cheonan-si (KR)

( * ) Notice: Subject to any disclaimer, the term of this patent is extended or adjusted under 35 U.S.C. 154(b) by 787 days.

(21) Appl. No.: 18/147,413

(22) Filed: Dec. 28, 2022

(65) Prior Publication Data

US 2023/0207366 A1 Jun. 29, 2023

(30) Foreign Application Priority Data

Dec. 29, 2021 (KR) ........................ 10-2021-0191361
Mar. 31, 2022 (KR) ........................ 10-2022-0040765

(51) Int. Cl.
*H10P 72/30* (2026.01)
*B65G 47/90* (2006.01)
*H10P 72/00* (2026.01)
*H01J 37/32* (2006.01)

(52) U.S. Cl.
CPC .......... *H10P 72/3402* (2026.01); *B65G 47/90* (2013.01); *H10P 72/0606* (2026.01); *H10P 72/0608* (2026.01); *H10P 72/0616* (2026.01); *H10P 72/3406* (2026.01); *H10P 72/3411* (2026.01)

(58) Field of Classification Search
CPC ......... H01L 21/67766; H01L 21/67259; H01L 21/67265; H01L 21/67288; H01L 21/67772; H01L 21/67778; B65G 47/90
See application file for complete search history.

(56) References Cited

U.S. PATENT DOCUMENTS 4,630,051 A * 12/1986 Adams .................... G01S 13/89 342/156
5,057,974 A * 10/1991 Mizobe ................ G02B 6/0065 362/23.15
2004/0225408 A1* 11/2004 Whitcomb ........ H01L 21/67265 700/213

(Continued)

FOREIGN PATENT DOCUMENTS

JP 2002-093884 A 3/2002
JP 2009302392 A * 12/2009

(Continued)

OTHER PUBLICATIONS

JP-2009302392-A (Year: 2009).*

*Primary Examiner* — Ernesto A Suarez
*Assistant Examiner* — Laurence R Brothers
(74) *Attorney, Agent, or Firm* — Harness, Dickey & Pierce, P.L.C.

(57) ABSTRACT

The present invention provides an apparatus for treating a substrate. The apparatus for treating a substrate comprises: a first module; and a treating module configured to treat the substrate, and the first module includes: a load port on which a container having the substrate accommodated therein is placed; a transfer unit having a hand that transfers the substrate between the load port and the treating module; and an observation unit mounted in the transfer unit and configured to observe a state of the substrate accommodated in the container.

10 Claims, 10 Drawing Sheets

(56) References Cited

U.S. PATENT DOCUMENTS

| | | | | |
|---|---|---|---|---|
| 2005/0110974 | A1 * | 5/2005 | Hashimoto | G03B 27/58 355/72 |
| 2008/0056857 | A1 * | 3/2008 | Hiroki | H10P 72/53 211/41.18 |
| 2020/0286752 | A1 * | 9/2020 | Toyomaki | H10P 72/14 |

FOREIGN PATENT DOCUMENTS

| | | | |
|---|---|---|---|
| KR | 100296668 | B1 | 10/2001 |
| KR | 101181162 | B1 | 9/2012 |
| KR | 10-2017-0073798 | A | 6/2017 |
| KR | 10-2020-0107810 | A | 9/2020 |

* cited by examiner

APPARATUS FOR TREATING SUBSTRATE AND METHOD FOR TREATING SUBSTRATE

CROSS-REFERENCE TO RELATED APPLICATIONS

This application claims priority to and the benefit of Korean Patent Application Nos. 10-2021-0191361 and 10-2022-0040765 filed in the Korean Intellectual Property Office on Dec. 29, 2021, and Mar. 31, 2022, the entire contents of which are incorporated herein by reference.

TECHNICAL FIELD

The present invention relates to an apparatus for treating a substrate and a method for treating a substrate.

BACKGROUND ART

A semiconductor manufacturing process is advanced by performing a predetermined treatment on a substrate. The substrate on which the predetermined treatment has been performed, or the substrate on which the predetermined treatment will be performed, is accommodated in a container and then transferred. In the container, the substrate is mounted in upper parts of slots installed inside the container.

Events such as distortion of a position of a substrate inside the container due to an external physical action may occur in the process of transferring the container or seating the substrate in the container. The substrate accommodated in the container is damaged or the seating position of the substrate is changed. In order to transfer the substrate from the inside of the container to the outside of the container, it is necessary to accurately determine the state of the substrate accommodated in the container. If the state of the substrate accommodated in the container is not accurately determined, a transfer unit that transfers the substrate collides with the substrate, resulting in additional damage to the substrate.

When the substrate is transferred from the inside of the container to the outside of the container such as a treating unit in a state in which the state of the substrate is not in a normal state inside the container, the substrate cannot be accurately seated on a support unit in the treating unit. If the substrate is not seated at an accurate process position inside the treating unit, process errors may occur with respect to the substrate, and it is difficult to uniformly treat the substrate.

SUMMARY OF THE INVENTION

The present invention has been made in an effort to provide an apparatus for treating a substrate and a method for treating a substrate which can determine a state of the substrate accommodated in the container.

The present invention has also been made in an effort to provide an apparatus for treating a substrate and a method for treating a substrate which can simultaneously determine states of all the substrates accommodated in the container.

The present invention has also been made in an effort to provide an apparatus for treating a substrate and a method for treating a substrate which can selectively determine a state of a specific substrate accommodated in the container.

The object of the present invention is not limited thereto, and other objects not mentioned will be clearly understood by those of ordinary skill in the art from the following description.

An exemplary embodiment of the present invention provides an apparatus for treating a substrate, comprising: a first module; and a treating module configured to treat the substrate, and the first module may include: a load port on which a container having the substrate accommodated therein is placed; a transfer unit having a hand that transfers the substrate between the load port and the treating module; and an observation unit mounted in the transfer unit and configured to observe a state of the substrate accommodated in the container.

According to the exemplary embodiment, the observation unit may be provided to simultaneously observe states of all the substrates accommodated in the container at a preset reference position.

According to the exemplary embodiment, the observation unit may be installed in an end of the hand, and may observe states of a plurality of substrates accommodated in the container in a state in which the hand is fixed to the reference position.

According to the exemplary embodiment, the observation unit may include: a data collection portion configured to collect time data on the time taken for light to be reflected and received from the substrate after irradiating the light to the substrate accommodated in the container; and a determination portion configured to estimate a relative distance between a substrate accommodated in the container according to the time data and the observation unit, and determine the state of the substrate accommodated in the container by differently matching specific colors for each distance data.

According to the exemplary embodiment, the first module further may include an auxiliary observation unit configured to selectively observe the states of the substrates by irradiating a laser individually toward each of the substrates accommodated in the container, and wherein the auxiliary observation unit may observe the state of the substrate by measuring an actual distance between the substrate and the auxiliary observation unit by using the laser irradiated to the substrate accommodated in the container.

According to the exemplary embodiment, the auxiliary observation unit may be installed in the end of the hand.

According to the exemplary embodiment, the transfer unit may further include a driver configured to drive the hand, and the auxiliary observation unit may irradiate the laser to the substrate accommodated in the container while the hand moves vertically by the driver.

According to the exemplary embodiment, the apparatus for treating a substrate may further includes a controller configured to control the transfer unit, the observation unit, and the auxiliary observation unit, and the controller may control the transfer unit, the observation unit, and the auxiliary observation unit so as to primarily observe the state of the substrate accommodated in the container using the observation unit and secondarily observing the state of the substrate using the auxiliary observation unit.

According to the exemplary embodiment, when the hand is moved to the reference position to primarily observe the substrate and the substrate accommodated in the container is determined to be in an abnormal state from the primary observation, the controller may control the transfer unit, the observation unit, and the auxiliary observation unit such that the hand is vertically moved to secondly observe the substrate in the abnormal state.

Another exemplary embodiment of the present invention provides a method of treating a substrate by determining a state of the substrate accommodated in a container placed on a load port, and a door of the container is opened and the state of the substrate accommodated in the container with the door opened is determined by using an observation unit installed in a transfer unit that transfers the substrate from the load port.

According to the exemplary embodiment, the observation unit may be provided to simultaneously observe states of all the substrates accommodated in the container in a state in which the transfer unit is disposed at a preset reference position.

According to the exemplary embodiment, the observation unit may collect time data on the time taken for light to be reflected and received from the substrate after irradiating the light to the substrate accommodated in the container, and estimates a relative distance between the substrate accommodated in the container according to the collected time data and the observation unit.

According to the exemplary embodiment, the observation unit may determine the state of the substrate accommodated in the container by differently matching specific colors for each data on the relative distance.

According to the exemplary embodiment, the method may irradiate a laser individually toward each of the substrates accommodated in the container with the door opened by using an auxiliary observation unit installed in the transfer unit, and selectively observer the state of the substrate by measuring an actual distance between the substrate and the auxiliary observation unit using the irradiated laser.

According to the exemplary embodiment, the auxiliary observation unit may irradiate the laser toward each of the substrates accommodated in the container while the transfer unit moves in a vertical direction.

According to the exemplary embodiment, the state of the substrate may be primarily observed using the observation unit, and be secondly observed using the auxiliary observation unit.

According to the exemplary embodiment, when the transfer unit may be moved to the reference position to primarily observe the substrate and the substrate accommodated in the container is determined to be in an abnormal state from the primary observation, the transfer unit may be moved vertically to secondarily observe the substrate in the abnormal state.

According to the exemplary embodiment, the state of the substrate determined by the observation unit may be at least one of a distance between the transfer unit and the substrate accommodated in the container, the presence or absence of the substrate accommodated in the container, distortion of the substrate accommodated in the container, and a damage of the substrate accommodated in the container.

Still another exemplary embodiment of the present invention provides an apparatus for treating a substrate comprising: a first module; and a treating module configured to treat the substrate, and the first module may include: a load port on which the container having the substrate accommodated therein is placed; a transfer frame disposed between the load port and the treating module and configured to transfer the substrate; a transfer unit disposed in the transfer frame and having a hand for transferring the substrate between the load port and the treating module; an observation unit installed in the hand and configured to simultaneously observe states of all the substrates accommodated in the container in a state in which the hand is disposed in a preset reference position; and an auxiliary observation unit installed on the hand at a position not overlapping the observation unit and configured to irradiate a laser toward a specific substrate accommodated in the container while the hand moves vertically and selectively observe the state of the specific substrate.

According to the exemplary embodiment, the observation unit may collect time data on the time taken for light to be reflected and received from the substrate after irradiating the light to the substrate accommodated in the container, estimate a relative distance between the substrate accommodated in the container according to the collected time data and the observation unit, and primarily determine the state of the substrate accommodated in the container by differently matching specific colors for each distance data, and the auxiliary observation unit may irradiate a laser toward the specific substrate accommodated in the container, measure an actual distance between the specific substrate and the auxiliary observation unit using the irradiated laser, and secondly determine the state of the specific substrate accommodated in the container.

According to the exemplary embodiment of the present invention, it is possible to determine a state of a substrate accommodated in a container.

In addition, according to the exemplary embodiment of the present invention, it is possible to simultaneously determine states of all the substrates accommodated in the container.

In addition, according to the exemplary embodiment of the present invention, it is possible to selectively determine a state of a specific substrate accommodated in the container.

The effect of the present invention is not limited to the foregoing effects, and those skilled in the art may clearly understand non-mentioned effects from the present specification and the accompanying drawings.

DETAILED DESCRIPTION

Figure 1:
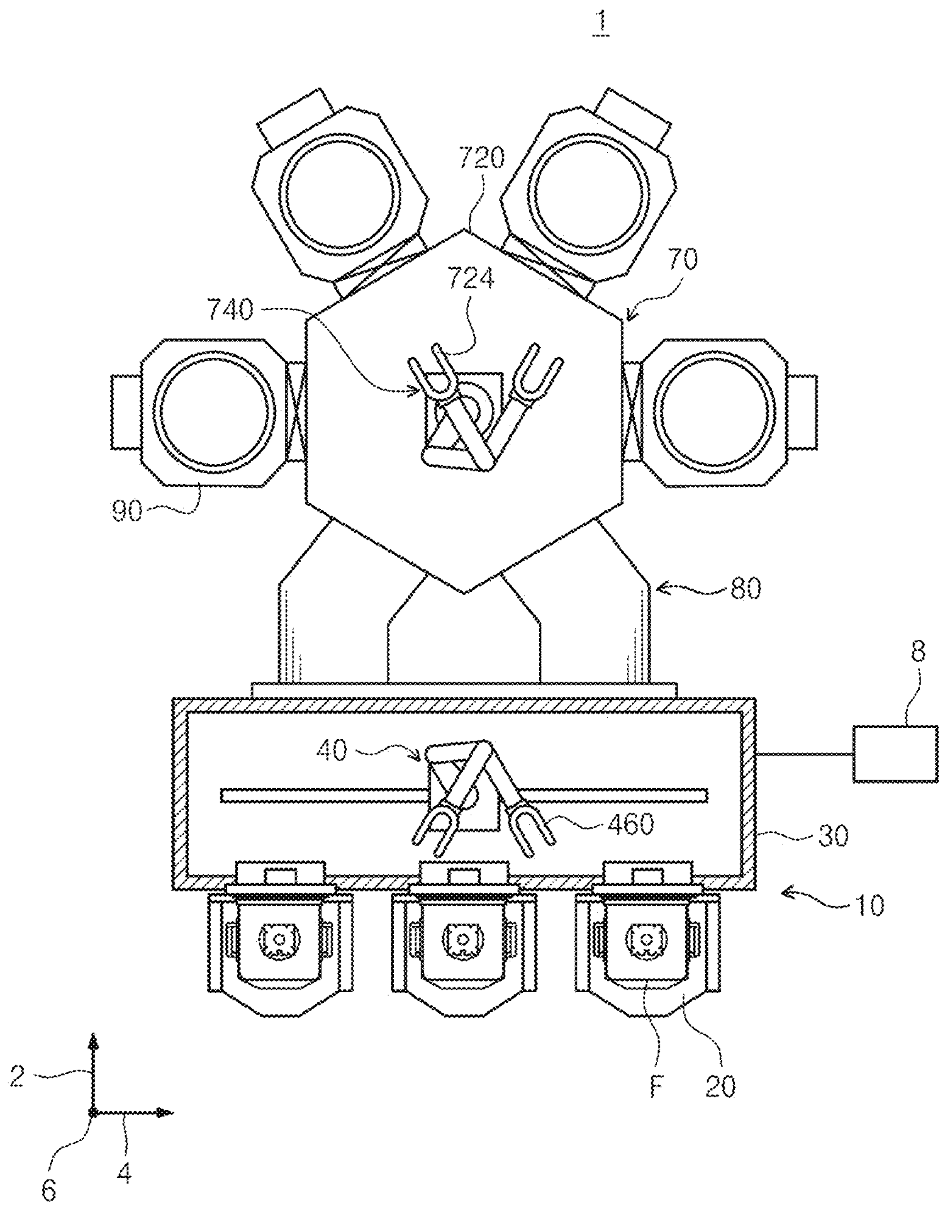
FIG. 1 is a view schematically illustrating an apparatus for treating a substrate according to the exemplary embodiment of the present invention.

Hereinafter, exemplary embodiments of the present invention will be described in more detail with reference to the accompanying drawings. An exemplary embodiment of the present invention may be modified in various forms, and the scope of the present invention should not be construed as being limited by the exemplary embodiment described below. The present exemplary embodiment is provided to more completely explain the present invention to those skilled in the art. Therefore, the shapes of components in the drawings are exaggerated to emphasize a clearer description.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Hereinafter, the exemplary embodiment of the present invention will be described in detail with reference to FIGS. 1 to 14.

FIG. 1 is a view schematically illustrating an apparatus for treating a substrate according to the exemplary embodiment of the present invention. Referring to FIG. 1, an apparatus 1 for treating a substrate according to the exemplary embodiment of the present invention includes a controller 8, a first module 10, a second module 70, a load lock chamber 80, and a treating module 90.

The controller 8 has a process controller made up of a microprocessor (computer) that controls the apparatus 1 for treating a substrate, a keyboard on which an operator performs command input operations to manage the apparatus 1 for treating a substrate, a user interface made up of a display that visualizes and displays an operation condition of the apparatus 1 for treating a substrate, and a storage unit in which a control program for executing a treatment performed in the apparatus 1 for treating a substrate under the control of the process controller or a program for executing treatments for each component according to various data and treatment conditions, that is, a treatment recipe, is stored. In addition, the user interface and the storage unit may be connected to the process controller. The treatment recipe may be accommodated in a storage medium among the storage units, and the storage medium may be a hard disk, a portable disk such as a CD-ROM or a DVD, or a semiconductor memory such as a flash memory.

The controller 8 may control the apparatus 1 for treating a substrate to perform a method for treating a substrate described below. For example, the controller 8 may control components provided in the apparatus 1 for treating a substrate to perform the method for treating a substrate described below.

Figure 2:
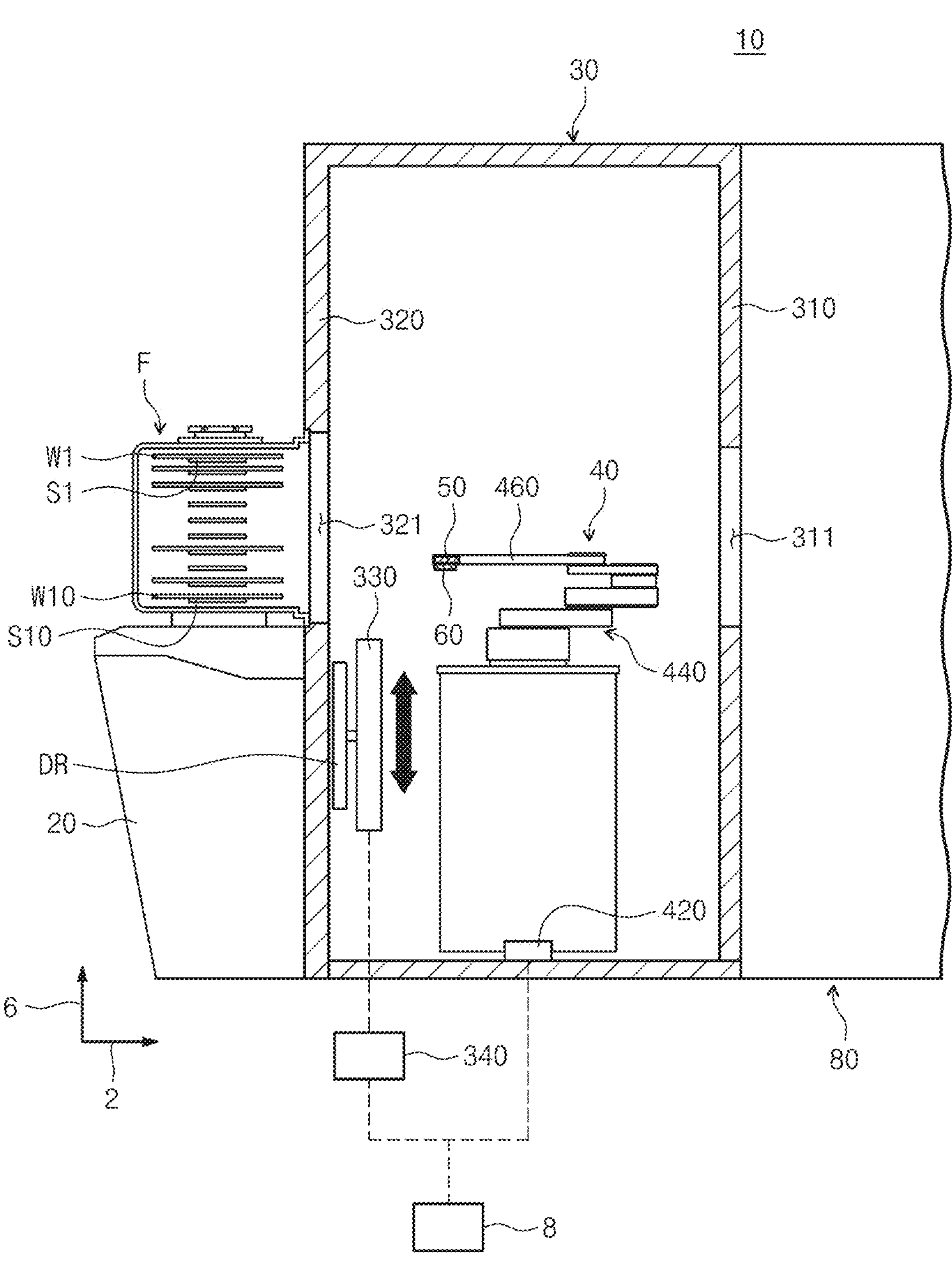
FIG. 2 is a view schematically illustrating a first module according to the exemplary embodiment of FIG. 1 when viewed from the side.

FIG. 2 is a view schematically illustrating a first module according to the exemplary embodiment of FIG. 1 when viewed from the side. Referring to FIGS. 1 and 2, the first module 10 and the second module 70 described below may be arranged in a first direction 2. Hereinafter, when viewed from the top, a direction perpendicular to the first direction 2 is defined as a second direction 4. In addition, when viewed from the top, a direction perpendicular to a plane including both the first direction 2 and the second direction 4 is defined as a third direction 6. Here, the third direction 6 may refer to a direction perpendicular to the ground.

The first module 10 may selectively transfer the substrate W between a container F described below and the load lock chamber 80. For example, the first module 10 may withdraw the substrate W from the container F and transfer the substrate W to the load lock chamber 80, or may withdraw the substrate W from the load lock chamber 80 and transfer the substrate W to the container F.

The first module 10 may include a load port 20, a transfer frame 30, a transfer unit 40, an observation unit 50, and an auxiliary observation unit 60.

The load port 20 may be disposed in one side of the transfer frame 30 described below. At least one load port 20 may be provided. A plurality of load ports 20 may be arranged in a line along the second direction 4. The number of load ports 20 may increase or decrease according to process efficiency and foot print conditions.

The container F according to the exemplary embodiment of the present invention may be placed on the load port 20. The container F may be loaded in or unloaded from the load port 20 by an operator or a transfer means (not illustrated), such as an overhead transfer apparatus (OHT), an overhead conveyor, or an automatic guided vehicle.

The container F may include various types of containers F depending on the type of article to be accommodated. For example, the container F may be a sealed container such as a front opening unified pod (FOUP).

A slot S is installed in an inner space of the container F. A plurality of slots S are provided. The plurality of slots S may be installed on a sidewall of the container F. The plurality of slots S may be vertically spaced apart from each other on the sidewall of the container F. A substrate W is seated on an upper portion of the slot S. The substrate W is seated on the upper portion of the slot S and accommodated in the inner space of the container F.

Hereinafter, for convenience of description, a case in which ten slots S are respectively installed on each of the sidewalls facing each other inside the container F will be described as an example. For example, the case in which a first slot S1 to a tenth slot S10 are installed in a direction extending from an upper end to a lower end of the inner space of the container F will be described as an example. The substrate W seated on the first slot S1 is defined as a first substrate W1, and the substrate W seated on the tenth slot S10 is defined as a tenth substrate W10.

The transfer frame 30 is provided between the load port 20 and the load lock chamber 80. The load port 20 may be connected to the transfer frame 30. The transfer frame 30 may have a substantially rectangular parallelepiped shape. The transfer frame 30 has a transfer space for transferring the substrate W inside. An interior of the transfer frame 30 may be provided at normal pressure. The transfer frame 30 may be maintained in an atmospheric pressure atmosphere.

Among the sidewalls of the transfer frame 30, a rear wall 310 disposed adjacent to the load lock chamber 80 described below may be provided with a carry-in entrance 311 that functions as a passage for transferring the substrate W. A front wall 320 facing the rear wall 310 may be provided with an opening 321. The substrates W placed in the container F may be transferred from the opening 321 to the load lock chamber 80 through the carry-in entrance 311 by the transfer unit 40 described below.

The transfer unit 40 described below, a door opener 330, and a fan filter unit (not illustrated) may be disposed inside the transfer frame 30.

The door opener 330 opens or closes a door DR of the container F disposed on the load port 20. At least one door opener 330 may be provided. The door opener 330 may be provided to correspond to the number of containers F placed on the load port 20. The door opener 330 may move in a sliding manner toward the third direction 6 by a driving device 340. The door opener 330 may be coupled to the door DR of the container F to slide downwardly with respect to the ground. Accordingly, the container F may be opened. The driving device 340 may be provided as a known device that provides a driving force in a vertical direction.

The fan filter unit (not illustrated) may be provided in an upper part of the transfer frame 30. The fan filter unit (not illustrated) may supply an external airflow to an inner space of the transfer frame 30. The fan filter unit (not illustrated) may maintain the inside of the transfer frame 30 at a constant cleanliness.

The transfer unit 40 is disposed in the inner space of the transfer frame 30. The transfer unit 40 may transfer the substrate W between the container F mounted on the load port 20 and the load lock chamber 80 described below. For example, the transfer unit 40 may transfer the substrate W on which a predetermined treatment is completed in the treating module 90 described below into the container F. The substrate W transferred to the inside of the container F may be mounted on the upper part of the slot S installed inside the container F. In addition, the transfer unit 40 may transfer a waiting substrate W from the container F to the load lock chamber 80 so as to perform a predetermined treatment in the treating module 90 described below.

The transfer unit 40 may include a rail 420, a driver 440, and a hand 460. A longitudinal direction of the rail 420 may be provided along the second direction 4 in the transfer frame 30. The driver 440 may move along the rail 420. The driver 440 may move along the second direction 4 on the rail 420. Accordingly, the driver 440 may move forward and backward along the rail 420. The driver 440 may move the hand 460 described below by one rotation around the third direction 6 as an axis. Accordingly, the hand 460 may move in the first direction 2. In addition, the driver 440 may vertically move the hand 460 in the third direction 6. The driver 440 may include an arm and a rod. The hand 460 may be installed in an upper end of the driver 440.

Figure 3:
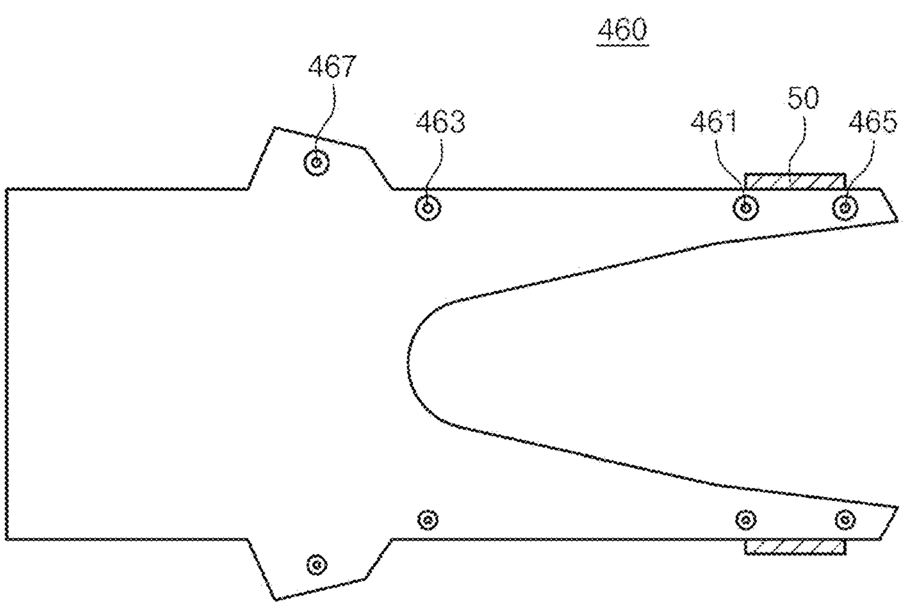
FIG. 3 is a view schematically illustrating a hand according to the exemplary embodiment of FIG. 2 when viewed from the top.

FIG. 3 is a view schematically illustrating a hand according to the exemplary embodiment of FIG. 2 when viewed from the top. Referring to FIG. 3, the hand 460 may transfer the substrate W. The substrate W may be placed on the hand 460. For example, the substrate W may be fixedly supported on an upper surface of the hand 460. In addition, the hand 460 may further transfer components used in the treating module 90. For example, the hand 460 may transfer a ring-shaped member (not illustrated) used in the treating module 90. According to the exemplary embodiment, the substrate W may be provided with a diameter smaller than that of the ring-shaped member (not illustrated).

Inner support portions 461 and 463 and outer support portions 465 and 467 may be formed on the upper surface of the hand 460. The inner support portions 461 and 463 and the outer support portions 465 and 467 may be implemented with pads having an elastic force. Alternatively, the inner support portions 461 and 463 and the outer support portions 465 and 467 may be provided in the form of a vacuum hole providing negative pressure.

The inner support portions 461 and 463 may support the substrate W. A plurality of inner support portions 461 and 463 may be provided. For example, the inner support portions 461 and 463 may support four lower surfaces of the substrate W. The inner support portions 461 and 463 may include a pair of first inner support portions 461 and a pair of second inner support portions 463. The pair of first inner support portions 461 and the pair of second inner support portions 463 may be combined with each other and may have a substantially circular shape when viewed from the top. The pair of first inner support portions 461 and the pair of second inner support portions 463 may be combined with each other and may overlap an edge region of the substrate W when viewed from the top.

The outer support portions 465 and 467 may support the ring-shaped member (not illustrated). A plurality of outer support portions 465 and 467 may be provided. For example, the outer support portions 465 and 467 may support four lower surfaces of the ring-shaped member (not illustrated). The outer support portions 465 and 467 may include a pair of first outer support portions 465 and a pair of second outer support portions 467. The pair of first outer support portions 465 and the pair of second outer support portions 467 may be combined with each other and may have a substantially circular shape when viewed from the top. The pair of first outer support portions 465 and the pair of second outer support portions 467 may be combined with each other and may overlap the ring-shaped member (not illustrated) when viewed from the top.

Figure 4:
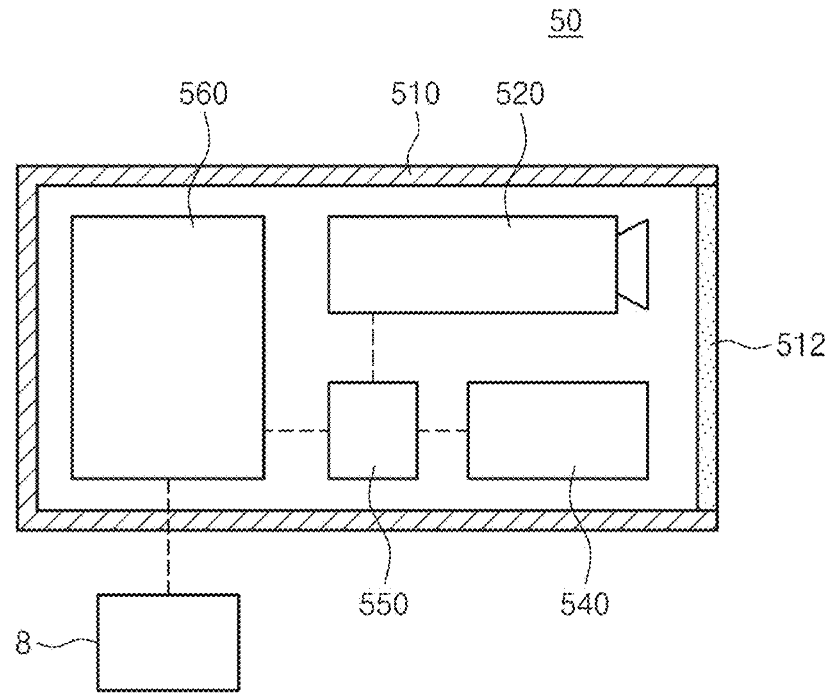
FIG. 4 is a block diagram illustrating an observation unit installed in the hand according to an embodiment of FIG. 3 when viewed from the top.

FIG. 4 is a block diagram illustrating an observation unit installed in the hand according to an embodiment of FIG. 3 when viewed from the top. Hereinafter, the observation unit 50 according to the exemplary embodiment of the present invention will be described in detail with reference to FIGS. 2 to 4.

The observation unit 50 is mounted in the transfer unit 40. According to the exemplary embodiment, the observation unit 50 may be installed in the hand 460. The observation unit 50 may be installed at an end of the hand 460. For example, the observation unit 50 may be installed on a side surface of the end of the hand 460. However, the present invention is not limited thereto, and the observation unit 50 may be installed in a position that does not interfere with the substrate W and/or the ring-shaped member (not illustrated) when the substrate W and/or the ring-shaped member (not illustrated) are seated on the hand 460. In this case, the observation unit 50 may be installed on the hand 460 in a direction toward the container F placed on the load port 20. At least one observation unit 50 may be installed in the hand 460.

The observation unit 50 observes a state of the substrate W and determines the state of the substrate W. The observation unit 50 observes and determines the state of the substrate W accommodated in the container F placed on the load port 20. The observation unit 50 simultaneously observes and determines all the states of the plurality of substrates W accommodated in the container F. In addition, the observation unit 50 collectively observes and determines the states of all the substrates W accommodated in the container F. The observation unit 50 collectively observes the states of all the substrates W accommodated in the container F at a fixed position. The state of the substrate W determined by the observation unit 50 may be at least one of a distance between the observation unit 50 or the transfer unit 40 and the substrate W accommodated in the container F, the presence or absence of the substrate W accommodated in the container F, distortion of the substrate W accommodated in the container F, and damage to the substrate W accommodated in the container F. A detailed mechanism for determining the state of the substrate W using the observation unit 50 will be described below.

The observation unit 50 may include a housing 510, an irradiation portion 520, a light receiving portion 540, a data collection portion 550, and a determination portion 560.

The housing 510 has a space therein. Components included in the observation unit 50 may be disposed in the inner space of the housing 510. The housing 510 may modularize the components included in the observation unit 50. The component modularized by the housing 510 according to the exemplary embodiment may be a time to flight (ToF). The housing 510 may prevent byproducts inside the transfer frame 30 from damaging the components included in the observation unit 50. A lens 512 may be installed in one side of the housing 510. Light emitted by the irradiation portion 520 described may be uniformly emitted to the outside of the housing 510 by the lens 512. In addition, light reflected and returned from a target object (e.g., the substrate W) by the lens 512 may be easily condensed by the light receiving portion 540 described below.

The irradiation portion 520 irradiates light toward the target object. The irradiation portion 520 irradiates light to the substrate W. According to the exemplary embodiment, the light emitted by the irradiation portion 520 may be infrared rays. Alternatively, the light emitted by the irradiation portion 520 may be laser light. The irradiation portion 520 may simultaneously irradiate light toward all the substrates W on which the door DR seated in the slots S of the container F in which the door DR placed on the load port 20 is opened. For example, the irradiation portion 520 irradiates the container F with light that may cover all area leading from an upper end of the container F to a lower end of the container F. That is, the irradiation portion 520 may irradiate light in a form in which light with uniform spatial spread of waves and regular phase is output in a time pattern at a certain interval and is surface-emitted in a certain pattern.

The light receiving portion 540 receives light reflected from the target object. The light receiving portion 540 receives light reflected from the substrate W. According to the exemplary embodiment, the light receiving portion 540 may simultaneously receive light reflected from the substrate W seated on the slots S of the container F in which the door DR placed on the load port 20 is opened.

The data collection portion 550 collects time data on the time taken for optical flight using light received from the light receiving portion 540. The data collection portion 550 may collect data on the time that it takes for the irradiation portion 520 to irradiate light and for the light receiving portion 540 to receive the light. For example, the data collection portion 550 may collect data on the time that it takes for the light to be reflected on the substrates W seated on the slot S inside the container F placed on the load port 20 and for the reflected light to be received back by the light receiving portion 540 after light is irradiated by the irradiation portion 520. That is, the time data may be a time obtained by adding a light irradiation time (or projection time) to a reflection time. The data collection portion 550 may transmit the collected time data to the determination portion 560.

The determination portion 560 analyzes the time data transmitted from the data collection portion 550. The determination portion 560 estimates a relative distance between the substrate W accommodated in the container F and the observation unit 50 from the time data. For example, the determination portion 560 may measure the relative distance between the substrate W accommodated in the container F and the observation unit 50 using the time data and the speed of light. The determination portion 560 may implement an image based on the estimated relative distance data. For example, the determination portion 560 may estimate each of the relative distances from each time data estimated from each received light, and may differently match specific colors for each of a plurality of estimated relative distances. According to the exemplary embodiment, the determination portion 560 may be implemented with an image sensor for measuring a phase difference according to the time data.

For example, it is assumed that the first substrate W1 accommodated in the first slot S1 of the container F is accommodated relatively farther from the observation unit 50 than the 10th substrate W10 accommodated in the tenth slot S10. In this case, a first light reflected from the first substrate W1 accommodated in the first slot S1 is received by the light receiving portion 540, and the light receiving portion 540 may obtain first time data. The determination portion 560 may match a first color (e.g., a color darker than a second color described below) with respect to the first substrate W1 using the first time data. In contrast, a tenth light reflected from the tenth substrate W10 accommodated in the tenth slot S10 is received by the light receiving portion 540, and the light receiving portion 540 may obtain tenth time data. The determination portion 560 may match the second color (e.g., a color brighter than the first color) with respect to the tenth substrate W10 using the tenth time data.

Figure 5:
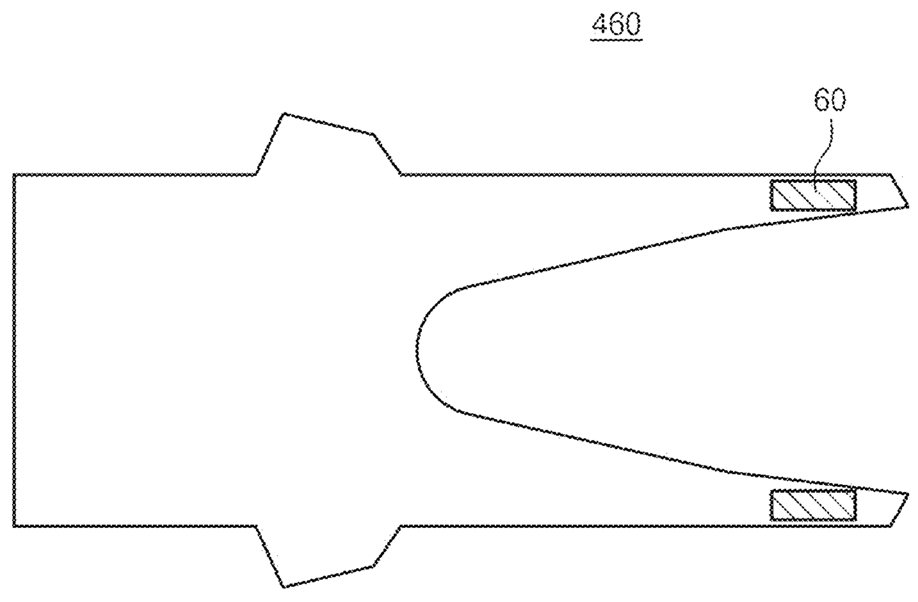
FIG. 5 is a view schematically illustrating the hand according to the exemplary embodiment of FIG. 2 when viewed from the bottom.
Figure 6:
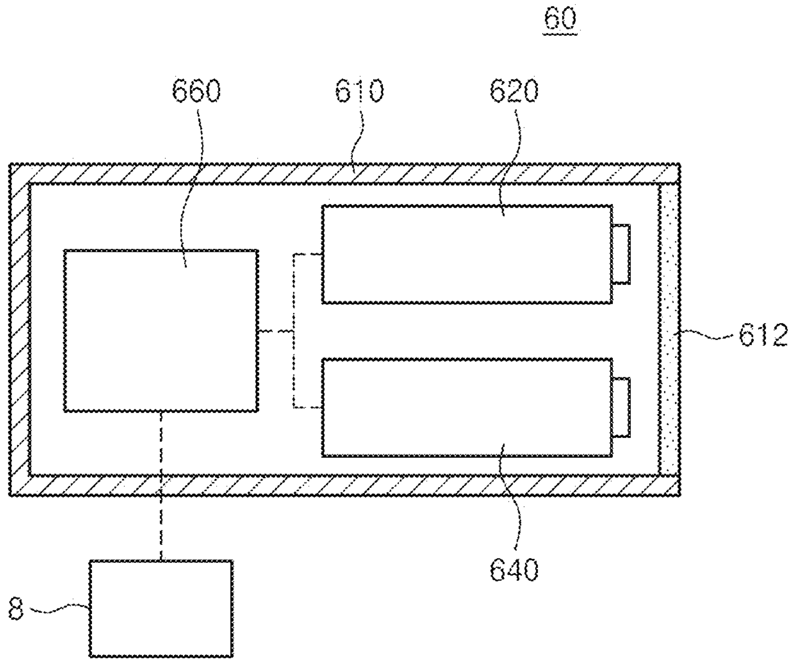
FIG. 6 is a block diagram illustrating an auxiliary observation unit installed in the hand according to the exemplary embodiment of FIG. 5 when viewed from the top.

FIG. 5 is a view schematically illustrating the hand according to the exemplary embodiment of FIG. 2 when viewed from the bottom. FIG. 6 is a block diagram illustrating an auxiliary observation unit installed in the hand according to the exemplary embodiment of FIG. 5 when viewed from the top. Hereinafter, the auxiliary observation unit 60 according to the exemplary embodiment of the present invention will be described with reference to FIGS. 2, 5, and 6.

The auxiliary observation unit 60 is mounted in the transfer unit 40. The auxiliary observation unit 60 may be mounted on an end of the hand 460. As illustrated in FIG. 5, the auxiliary observation unit 60 may be mounted on a lower end surface of the hand 460. However, the present invention is not limited thereto, and the auxiliary observation unit 60 may be installed in a position that does not interfere with the substrate W and/or the ring-shaped member (not illustrated) when the substrate W and/or the ring-shaped member (not illustrated) are seated on the hand 460. In addition, the auxiliary observation unit 60 is mounted at a position that does not overlap with the observation unit 50 installed on the hand 460. In this case, the auxiliary observation unit 60 may be installed on the hand 460 in a direction toward the container F placed on the load port 20. At least one auxiliary observation unit 60 may be installed in the hand 460.

The auxiliary observation unit 60 observes a state of the substrate W and determines the state of the substrate W. The auxiliary observation unit 60 observes and determines the state of the substrate W accommodated in the container F placed on the load port 20. The auxiliary observation unit 60 may irradiate light toward the target object. For example, the light irradiated by the auxiliary observation unit 60 may be a laser. The auxiliary observation unit 60 may individually irradiate a laser on each of the substrates W accommodated in the container F. The auxiliary observation unit 60 may selectively observe and determine the state of the substrate W seated in each of the slots S by irradiating the laser on each individual substrate W accommodated in the container F.

The state of the substrate W determined by the auxiliary observation unit 60 may be an actual distance between the auxiliary observation unit 60 or the transfer unit 40 and the substrate W accommodated in the container F, the presence or absence of the substrate W in a specific slot S inside the container F, a seating position of the substrate W in the specific slot S inside the container F.

According to the exemplary embodiment, the hand 460 is moved in the vertical direction (e.g., the third direction 6) by the driver 440, and the auxiliary observation unit 60 mounted in the hand 460 is also moved in the vertical direction. Accordingly, the auxiliary observation unit 60 moves between an upper end and a lower end of the container F, and during the movement of the auxiliary observation unit 60, the auxiliary observation unit 60 may selectively observe and determine the states of each of the substrates W seated inside the container F by irradiating the laser to the substrate W. A detailed mechanism thereof will be described below.

The auxiliary observation unit 60 may include a housing 610, a laser irradiation portion 620, a laser light receiving portion 640, and a reading portion 660.

The housing 610 has a space therein. Components included in the auxiliary observation unit 60 may be disposed in an inner space of the housing 610. The housing 610 may modularize the components included in the auxiliary observation unit 60. The component modularized by the housing 610 according to the exemplary embodiment may be a laser module. The housing 610 may protect the components included in the auxiliary observation unit 60 from byproducts outside the housing 610. A lens 612 may be installed in one side of the housing 610.

The laser irradiation portion 620 irradiates a laser toward the target object. The laser irradiation portion 620 irradiates the laser to the substrate W accommodated in the container F. The laser irradiation portion 620 may irradiate a laser having straightness. Accordingly, the laser irradiation portion 620 may individually irradiate the laser on each of the substrates W mounted on the slots S of the container F in which the door DR placed on the load port 20 is opened. The laser irradiated from the laser irradiation portion 620 is reflected from the substrate W and received by the laser light receiving portion 640 described below. The laser light receiving portion 640 receives the laser reflected from the substrate W. The data on the received laser is transmitted to the reading portion 660 described below.

The reading portion 660 may determine actual distance data between a target substrate W reflected by the laser and the auxiliary observation unit 60 using data on the laser received from the laser receiving portion 640. The reading portion 660 may determine the state of the substrate W accommodated in the container F placed on the load port 20 using the determined actual distance data. For example, the reading portion 660 can determine the present or absence of the substrate W in the slot S inside the container F and/or a position where the substrate W is mounted in the slot S.

Referring back to FIG. 1, the second module 70 may be disposed between the load lock chamber 80 described below and the treating module 90 described below. The second module 70 may include a transfer chamber 720 and a transfer robot 740.

An inner atmosphere of the transfer chamber 720 may be maintained in a vacuum atmosphere. At least one treating module 90 described below may be connected to the transfer chamber 720. The transfer chamber 720 may be provided in a polygonal shape. The load lock chamber 80 described below and the treating module 90 may be disposed around the transfer chamber 720. For example, as illustrated in FIG. 1, a hexagonal transfer chamber 720 may be disposed in a central part of the second module 70, and the load lock chamber 80 and the treating module 90 may be disposed around the transfer chamber 720. However, the shape of the transfer chamber 720 and the number of process chambers may be variously modified and provided according to a user's needs.

The transfer robot 740 may be disposed in the transfer chamber 720. For example, the transfer robot 740 may be disposed in a central part of the transfer chamber 720. The transfer robot 740 may transfer the substrate W between the load lock chamber 80 and the treating module 90. Optionally, the transfer robot 740 may transfer the substrate W between the treating modules 90. The transfer robot 740 may have a transfer hand 742 that moves forward or backward, or rotates on a horizontal plane. At least one transfer hand 742 may be provided. Since the structure of the transfer hand 742 is mostly provided similar to that of the hand 460 described above, a description thereof will be omitted below for avoiding overlapping explanations.

The load lock chamber 80 may be disposed between the transfer frame 30 and the transfer chamber 720. The load lock chamber 80 provides a buffer space in which the substrate W is exchanged between the transfer frame 30 and the transfer chamber 720.

As mentioned above, the inner atmosphere of the transfer frame 30 may be maintained in an atmospheric pressure atmosphere, and the inner atmosphere of the transfer chamber 720 may be maintained in a vacuum pressure atmosphere. The load lock chamber 80 is disposed between the transfer frame 30 and the transfer chamber 720 such that an inner atmosphere thereof can be switched between the atmospheric pressure atmosphere and the vacuum pressure atmosphere.

The treating module 90 according to one embodiment of the present invention performs a predetermined process on the substrate W. The treating module 90 may treat the substrate W using plasma. For example, the treating module 90 may perform an etching process of removing a thin film on the substrate W using plasma, an ashing process of removing a photoresist film, a deposition process of forming a thin film on the substrate W, or a dry-cleaning process. As a plasma source generated in the treating module 90 according to the exemplary embodiment, a known inductively coupled plasma (ICP) or microwave plasma may be used.

However, unlike the above-described embodiment, some of the treating modules 90 according to the exemplary embodiment of the present invention may perform an etching process or a photographic process on the substrate W before performing a plasma treatment on the substrate W, and other treating modules 90 may treat the substrate W using plasma.

Figure 7:
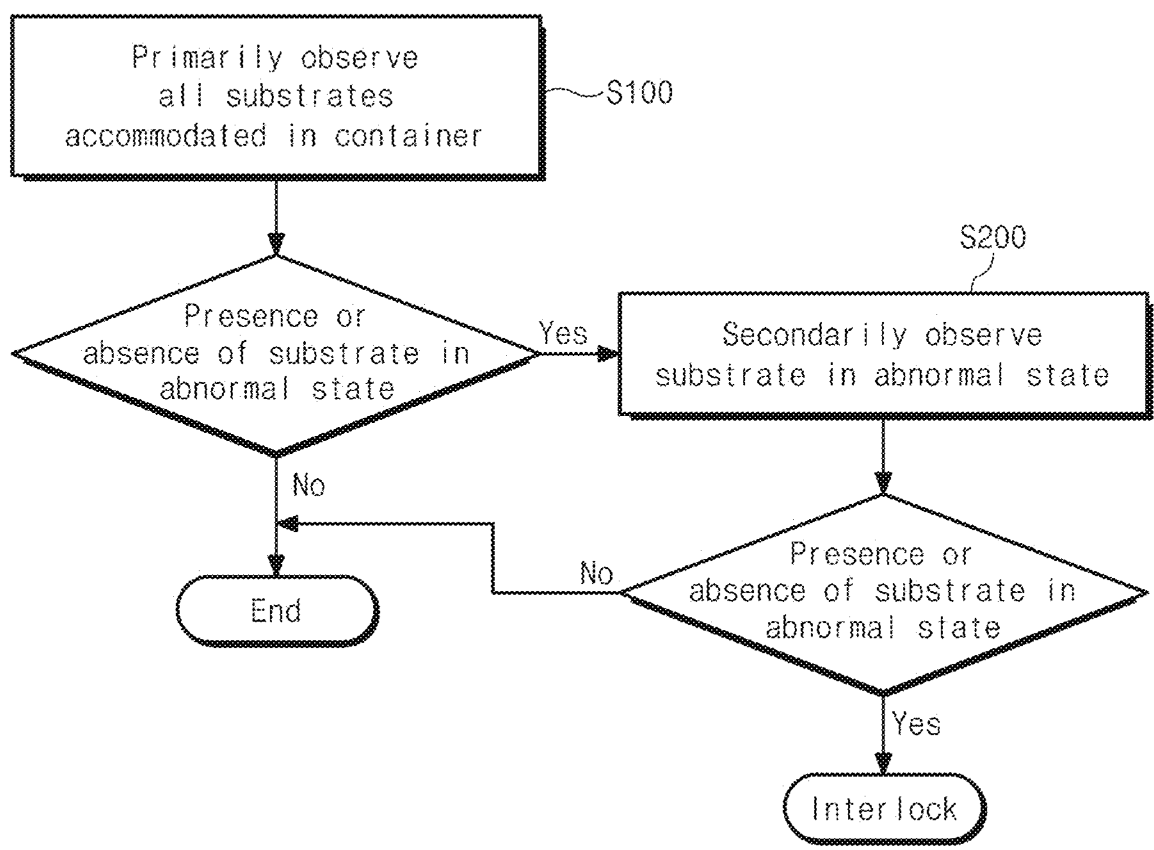
FIG. 7 is a flowchart of a method for treating a substrate according to the exemplary embodiment of the present invention.

FIG. 7 is a flowchart of a method for treating a substrate according to one embodiment of the present invention. Hereinafter, a method for treating a substrate according to the exemplary embodiment of the present invention will be described in detail with reference to FIG. 7.

The method for treating a substrate according to the exemplary embodiment of the present invention may be performed in the apparatus 1 for treating a substrate described above. In addition, the controller 8 may control the components of the apparatus 1 for treating a substrate so that the apparatus 1 for treating a substrate may perform the method for treating a substrate described below. For example, the controller 8 may control components included in the transfer unit 40, the observation unit 50, and the auxiliary observation unit 60 of the apparatus 1 for treating a substrate.

Referring to FIG. 7, the method for treating a substrate according to the exemplary embodiment may perform a primary observation step S100 and a secondary observation step S200. Both the primary observation step S100 and the secondary observation step S200 may be performed in a state in which the container F is placed on the load port 20. For example, both the primary observation step S100 and the secondary observation step S200 may be performed in a state in which the door DR of the container F placed on the load port 20 is opened.

In the primary observation step S100, the states of all the substrates W accommodated in the plurality of slots S inside the container F in which the door DR is opened is simultaneously observed. In the primary observation step S100, the hand 460 is fixed to a preset reference position, and the states of all the substrates W accommodated in the container F is observed and determined using the observation unit 50 mounted in the hand 460. A detailed mechanism for observing and determining the state of the substrate W in the primary observation step S100 will be described below with reference to FIGS. 8 to 12.

When it is determined in the primary observation step S100 that the substrate W in the abnormal state is present among the substrates W accommodated in the slots S, the secondary observation step S200 is performed on a specific substrate W determined to be in the abnormal state.

In the secondary observation step S200, the state of the specific substrate W determined to be in the abnormal state among the substrates W accommodated in the plurality of slots S inside the container F with the door DR opened is secondarily observed. In the secondary observation step S200, the hand 460 is moved in the third direction 6 such that the auxiliary observation unit 60 is located by the hand 460 at the same height as the specific substrate W determined to be in an abnormal state, and then, the state of the specific substrate W is observed and determined using the auxiliary observation unit 60. A detailed mechanism for observing and determining the state of the specific substrate W in the secondary observation step S200 will be described below with reference to FIGS. 13 and 14.

When the state of the specific substrate W determined by the secondary observation step S200 is determined to be in the abnormal state, an interlock is generated. Through the generated interlock, the operator may check the state of the specific substrate W accommodated in the container F. In contrast, when the specific substrate W determined in the secondary observation step S200 is determined not to be in an abnormal state, an observation mechanism for the substrates W accommodated in the container F may be terminated.

Figure 8:
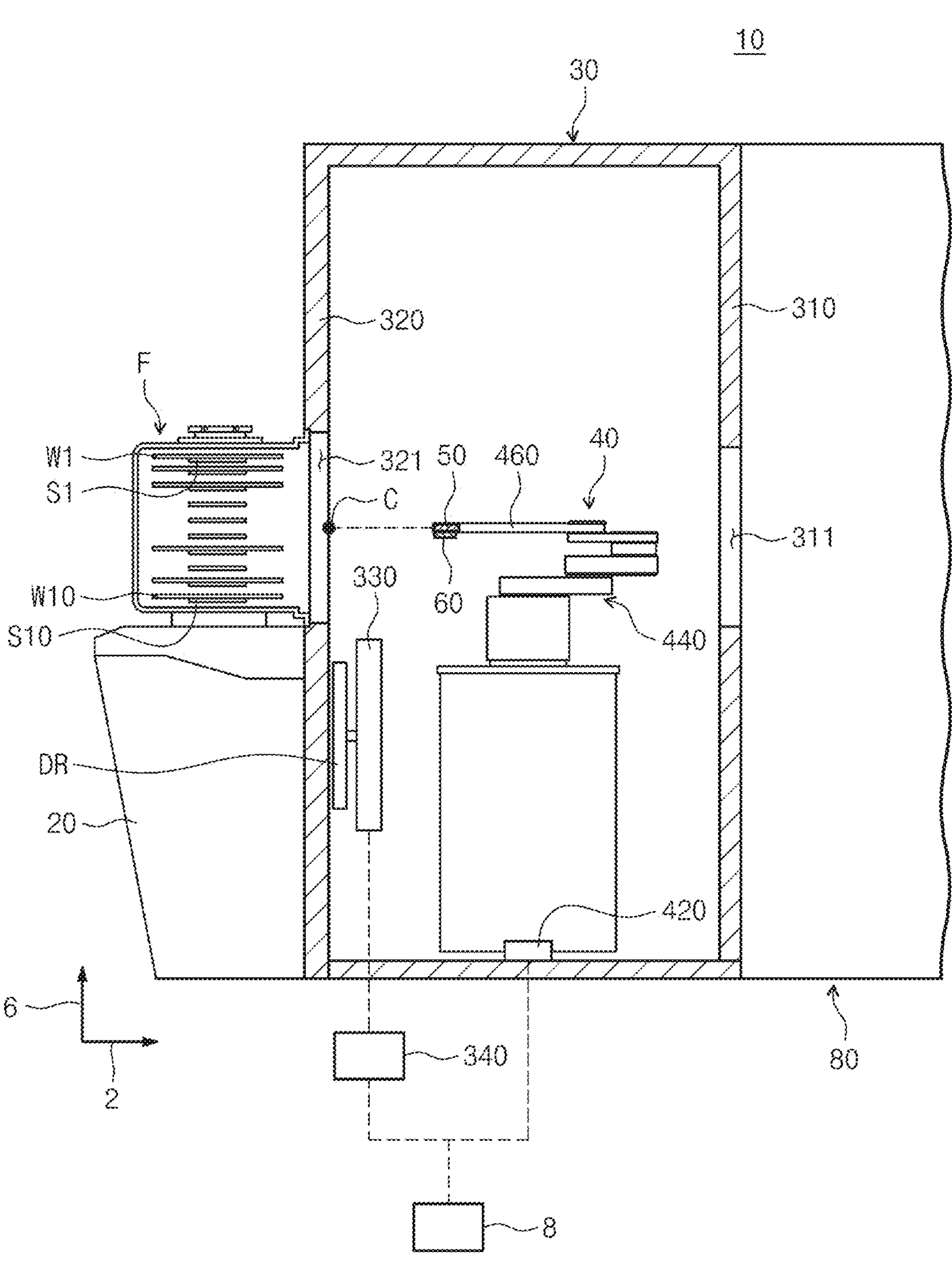
FIG. 8 is a view schematically illustrating the hand moving to a reference position for a primary observation of FIG. 7.

FIG. 8 is a view schematically illustrating the hand moving to the reference position for a primary observation of FIG. 7. Referring to FIG. 8, in the primary observation step S100, as described above, the states of all the substrates W accommodated in the container F is observed and determined using the observation unit 50. Before performing the primary observation step S100, the door DR of the container F placed on the load port 20 is opened by the door opener 330. When the door DR of the container F is moved downwardly by the door opener 330, the transfer unit 40 drives the driver 440 to move the hand 460 to the reference position. According to the exemplary embodiment, the reference position may be defined as an observation position where the observation unit 50 can observe all the substrates W accommodated in the container F.

The reference position may be a position where the center of the observation unit 50 coincides with a point on a virtual straight line horizontally from the center C of the container F when the door DR views the open container F from the front. As illustrated in FIG. 8, when the hand 460 is disposed relatively below the reference position, the driver 440 moves the hand 460 upwardly so as to move the hand 460 to the reference position. When the hand 460 is disposed at the reference position, the observation unit 50 performs the primary observation step S100.

Figure 9:
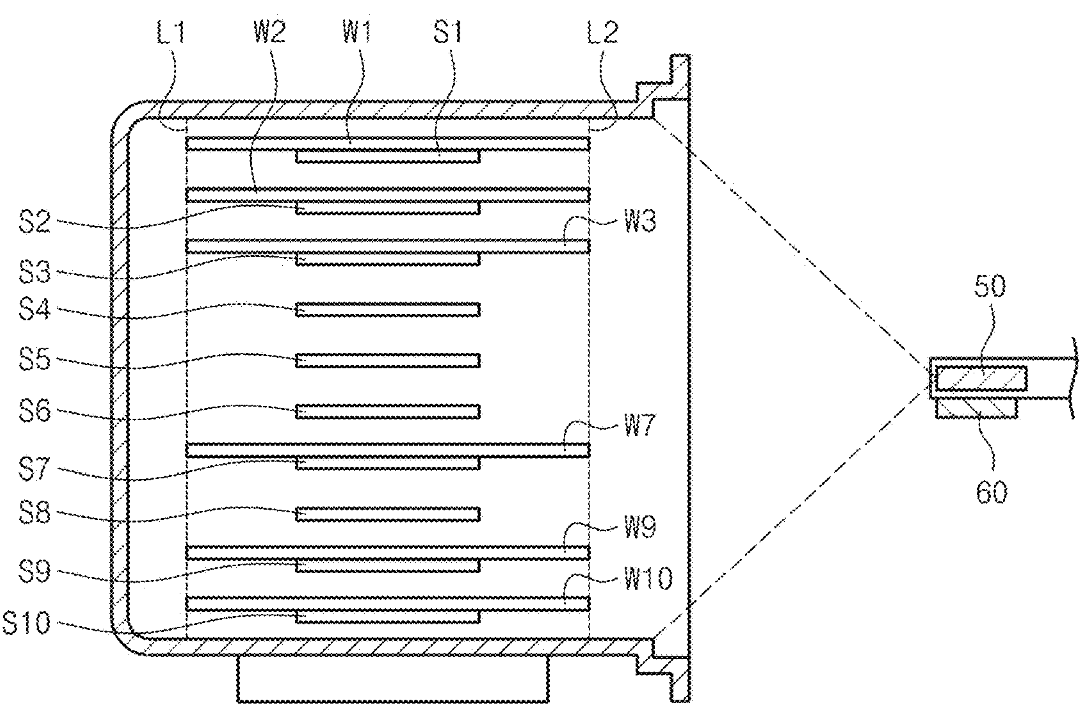
FIG. 9 is a side view illustrating one embodiment of the observation unit performing the primary observation of FIG. 7.
Figure 10:
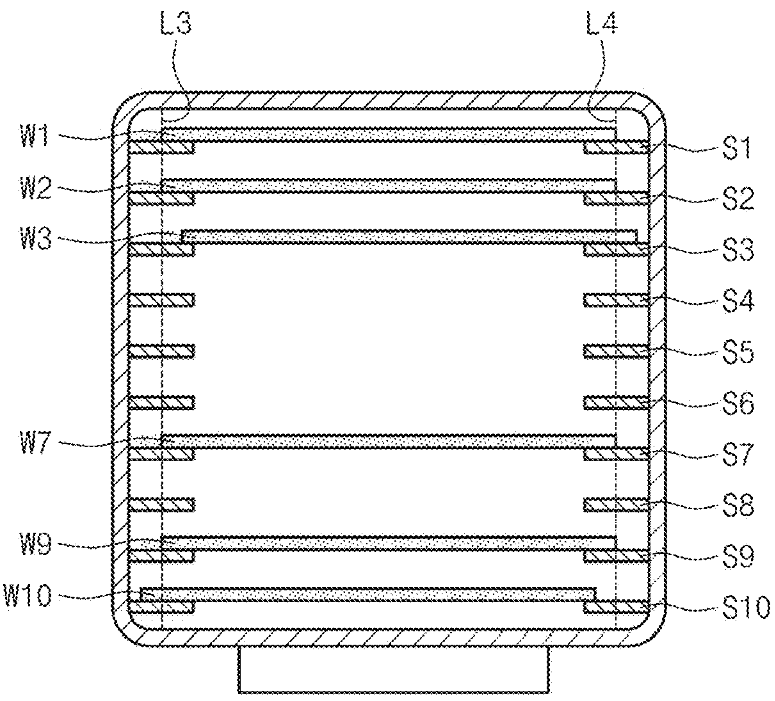
FIG. 10 is a front view illustrating one embodiment of determining a state of the substrate accommodated in a container by the primary observation of FIG. 7.

FIG. 9 is a side view illustrating one embodiment of the observation unit performing the primary observation of FIG. 7. FIG. 10 is a front view illustrating one embodiment of determining the state of the substrate accommodated in the container by the primary observation of FIG. 7.

Hereinafter, for convenience of explanation, when the container F is viewed from the side, when both ends of the substrate W mounted on the slot S are disposed on L1 and L2, which are virtual straight lines drawn in the container F in the vertical direction, the substrate W is defined as being seated in a given position on a side surface of the slot S. In addition, when the container F is viewed from the front, when both ends of the substrate W mounted on the slot S are disposed on L3 and L4, which are virtual straight lines drawn in the container F in the vertical direction, the substrate W is defined as being seated in a given position on a front surface of the slot S.

Referring to FIGS. 9 and 10, when the hand 460 is moved to the reference position, the irradiation portion 520 irradiates light toward the container F. The irradiation portion 520 irradiates the container F with light in a surface-emitting form that may cover all area leading from the upper end to the lower end of the container F. The light irradiated by the irradiation portion 520 is irradiated to the substrate W seated in inner slots S of the container F. The light receiving portion 540 receives light reflected from the inside of the container F.

The data collection portion 550 collects time data on the time taken for an optical flight using light received from the light receiving portion 540. The data collection portion 550 may collect time data on the time taken until the light is received by the light receiving portion 540 after the irradiation portion 520 irradiates the light. For example, the data collection portion 550 transmits the collected time data to the determination portion 560.

The determination portion 560 analyzes the time data transmitted from the data collection portion 550. The determination portion 560 may estimate a relative distance between the components included in the container F and the observation unit 50 using the time data. For example, the determination portion 560 may collectively estimate the relative distance data between the substrates W existing in the container F and the observation unit 50. The determination portion 560 may implement an image based on the estimated relative distance data. For example, the determination portion 560 may estimate each of the relative distances using each time data estimated from each received light, and may implement the image by differently matching specific colors for each of the plurality of estimated relative distances.

In the image inside the container F implemented in the primary observation step S100, it is possible to compare the colors of the substrates W accommodated in the container F and the color of a reference image, and determine whether the colors are identical to each other. For example, the reference image may be an image in which all the substrates W in the inner slots S of the container F are seated in the given position.

For example, as illustrated in FIG. 9, each of the substrates W seated in the inner slots S of the container F may be disposed in the given position on a side surface of the container F. In addition, among the substrates W mounted on the inner slots S of the container F, a third substrate W3 mounted on a third slot S3 and the tenth substrate W10 mounted on the tenth slot S10 may be accommodated by deviating from the given position on the front surface of the container F.

In this case, the image of the state of the substrate W observed by the observation unit 50 may be expressed as illustrated in FIG. 10. That is, as illustrated in FIG. 10, since the substrates W are all disposed in the given position on the side surface of the container F, the substrates W accommodated in the container F may be expressed in the same color (e.g., gray). By comparing the image color of the implemented substrates W with the color of the substrate W of the reference image, it is possible to determine whether the substrate W is disposed in the given position of the slot S on the side surface of the container F.

However, in the images of the implemented substrates W, since the third substrate W3 mounted on the third slot S3 and the tenth substrate W10 mounted on tenth slot S10 are disposed outside the imaginary straight lines L3 and L4, respectively, it may be determined that the third substrate W3 and the tenth substrate W10 are twisted by deviating from the given positions of the slots S, respectively, on the front surface of the container F.

Figure 11:
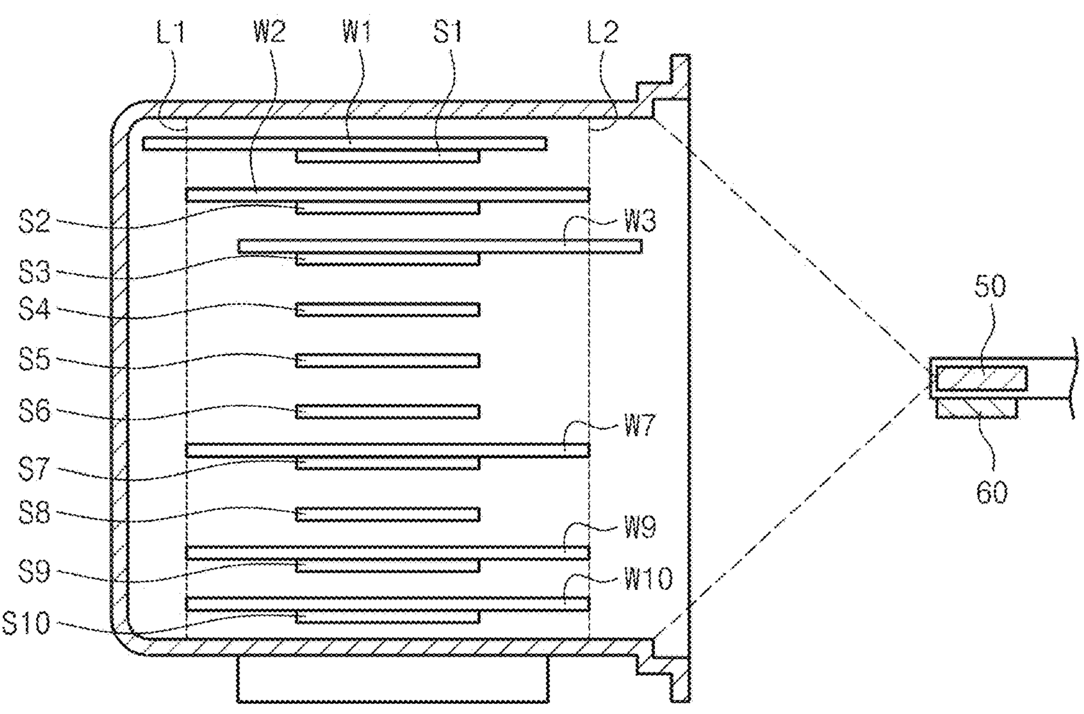
FIG. 11 is a side view illustrating one embodiment of the observation unit performing the primary observation of FIG. 7.
Figure 12:
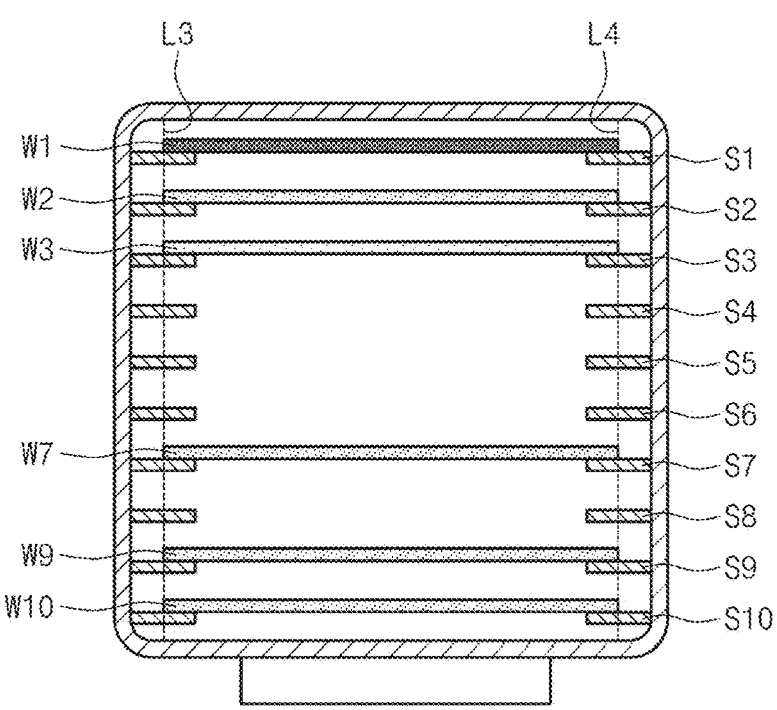
FIG. 12 is a front view illustrating one embodiment of determining a state of the substrate accommodated in the container by the primary observation of FIG. 7.

FIG. 11 is a side view illustrating one embodiment of the observation unit performing the primary observation of FIG. 7, and FIG. 12 is a front view illustrating one embodiment of determining a state of the substrate accommodated in the container by the primary observation of FIG. 7. Hereinafter, unlike the content described with reference to FIGS. 9 and 10, an example in which each of the substrates W seated in the inner slots S of the container F deviates from the given position on the side surface of the container F and is disposed and accommodated in the given position on the front surface of the container F will be described.

Referring to FIGS. 11 and 12, among the substrates W seated in the inner slots S of the container F, the first substrate W1 seated in the first slot S1 and the third substrate W3 seated in the third slot S3 may deviate from the given position on the side surface of the container F and be accommodated. For example, as illustrated in FIG. 11, the first substrate W1 deviates from the given position towards a side surface facing an opened side surface of the container F, and the third substrate W3 deviates from the given position towards the opened side surface of the container F. That is, on the side surface of the container F, the first substrate W1 is disposed relatively farther from the observation unit 50 disposed in the reference position than the other substrates W, and on the side surface of the container F, the third substrate W3 is disposed relatively closer to the observation unit 50 disposed in the reference position than the other substrates W.

In this case, the image of the state of the substrate W observed by the observation unit 50 may be expressed as illustrated in FIG. 12. That is, since the first substrate W1 is disposed far from the observation unit 50 as described above, the first substrate W1 may match a relatively dark color as compared to the remaining substrates W. In addition, since the third substrate W3 is disposed close to the observation unit 50 as described above, the third substrate W3 may match a relatively bright color as compared to the remaining substrates W. The image color of the substrates W observed and implemented by the observation unit 50 can be compared with the color of the substrate W of the reference image to determine that the substrate W has deviated from the given position of the slot S on the side surface of the container F.

In contrast, based on the images of the substrates W observed and implemented by the observation unit 50, since all ends of the substrates W are disposed in L3 and L4, which are virtual straight lines on the front surface of the container F, it may be determined that the substrates W will not deviate from the given position of the slot S on the front surface of the container F.

Using this mechanism using the observation unit 50, it is possible to simultaneously determine whether the substrate W is accommodated in each of the slots S installed inside the container F, whether the substrates W accommodated in the container F deviate from the given position, and/or whether the substrates W accommodated in the container F are damaged.

Figure 13:
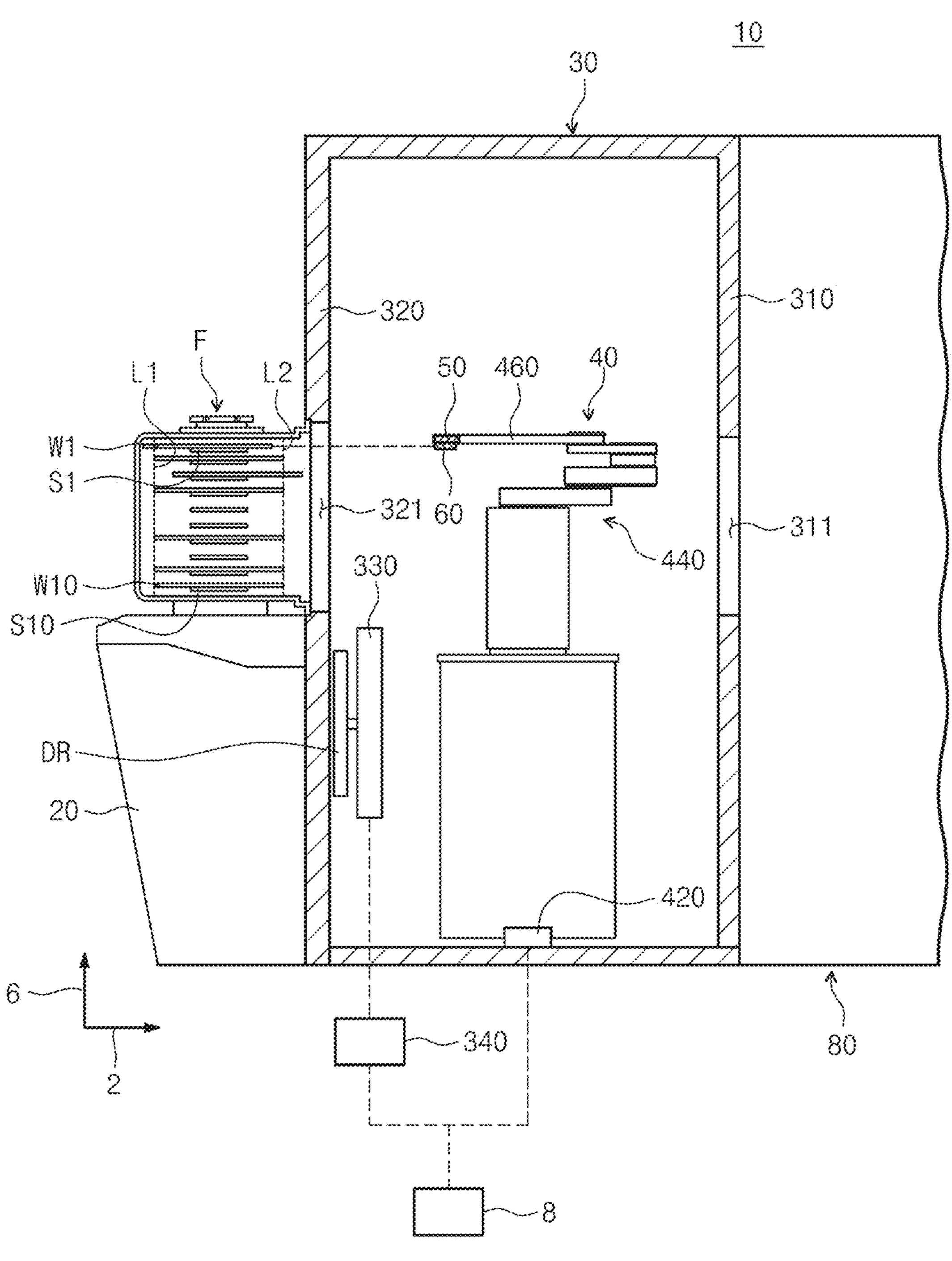
FIGS. 13 and 14 are side views illustrating one embodiment of the auxiliary observation unit performing a secondary observation of FIG. 7.
Figure 14:
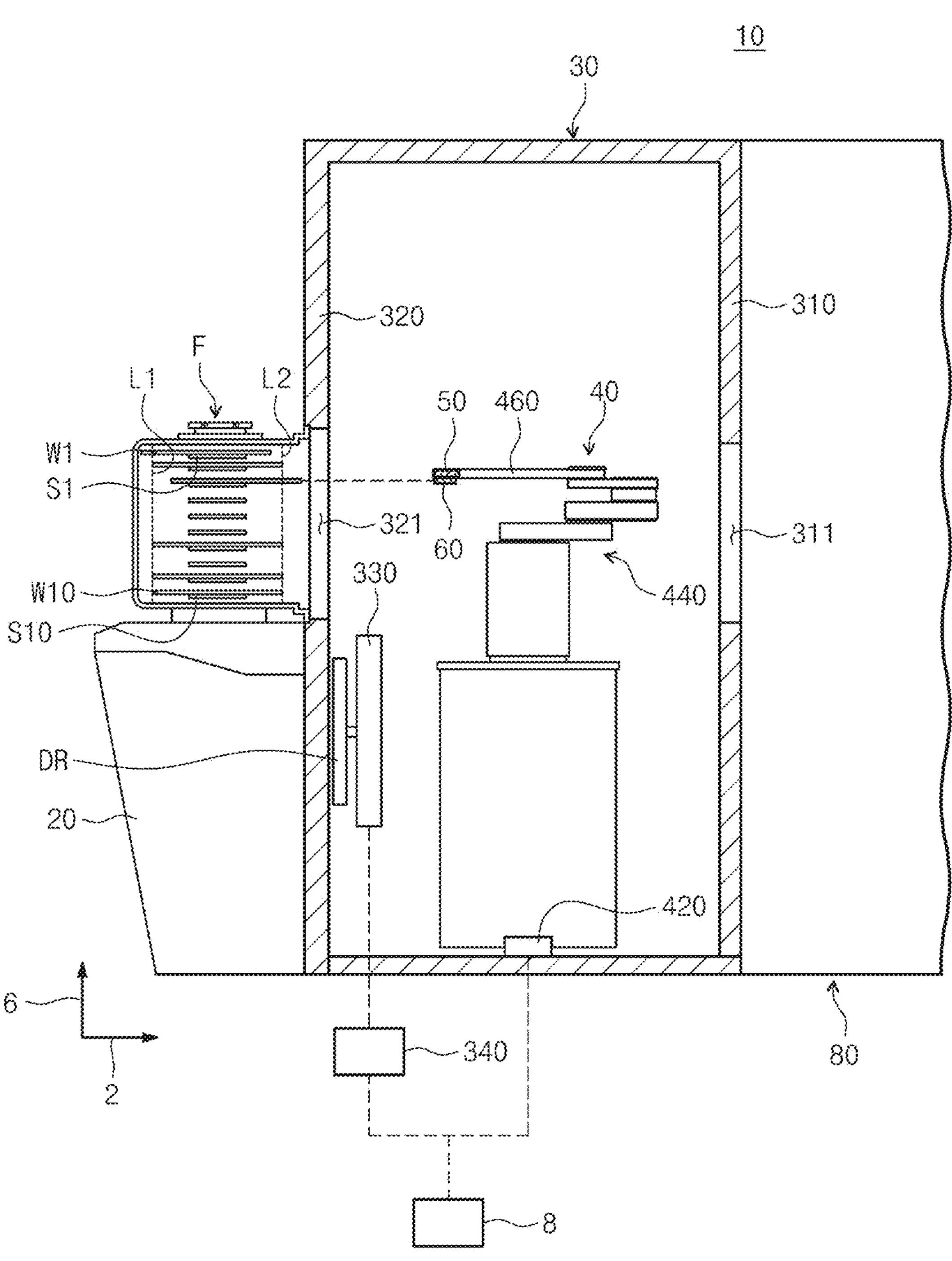

FIGS. 13 and 14 are side views illustrating one embodiment of the auxiliary observation unit performing a secondary observation of FIG. 7.

Hereinafter, based on the states of the substrates W accommodated in the container F described with reference to FIGS. 11 and 12, an example of selectively performing the secondary observation step S200 on the specific substrates W determined to be in the abnormal state using the auxiliary observation unit 60 will be described in detail with reference to FIGS. 13 and 14.

Referring to FIG. 13, when it is determined in the primary observation step S100 that the first substrate W1 and the third substrate W3 is in the abnormal state, the secondary observation step S200 is performed. In the secondary observation step S200, regarding the specific substrate W determined to be in the abnormal state in the primary observation step S100, the state of the corresponding specific substrate W is selectively observed and determined. According to the exemplary embodiment, in the secondary observation step S200, only the first substrate W1 and the third substrate W3 determined to be in the abnormal state are selectively observed and determined.

The driver 440 drives the hand 460 to move the auxiliary observation unit 60 mounted in the hand 460 to a position corresponding to the position on which the first substrate W1 is seated. For example, as illustrated in FIG. 13, when the container F is viewed from the front, the hand 460 is moved upwardly such that the first substrate W1 and the auxiliary observation unit 60 are disposed on the same line. The laser irradiation portion 620 irradiates a laser toward the first substrate W1, and the laser light receiving portion 640 receives the laser reflected from the first substrate W1. The reading portion 660 may determine actual distance data between the first substrate W1 on which the laser is reflected and the auxiliary observation unit 60 using data on the laser received from the laser receiving portion 640. The reading portion 660 may determine the state of the first substrate W1 using the actual distance data between the determined first substrate W1 and the auxiliary observation unit 60.

That is, it is possible to determine whether the first substrate W1 exists on the first slot S1, and/or whether the first substrate W1 placed on the first slot S1 is seated in the given position. Based on the determined actual distance data, the reading portion 660 may determine that the first substrate W1 has deviated from the given position of the first slot S1 on the side surface of the container F.

After the determination of the state of the first substrate W1 is completed, the driver 440 drives the hand 460 to move the auxiliary observation unit 60 mounted in the hand 460 to a position corresponding to the position on which the third substrate W3 is seated. The laser irradiation portion 620 irradiates a laser toward the third substrate W3, and the laser light receiving portion 640 receives the laser reflected from the third substrate W3. The reading portion 660 may determine actual distance data between the third substrate W3 on which the laser is reflected and the auxiliary observation unit 60 using data on the laser received from the laser light receiving portion 640. The reading portion 660 may determine the state of the third substrate W3 using the actual distance data between the determined third substrate W3 and the auxiliary observation unit 60.

That is, it is possible to determine whether the third substrate W3 exists on the third slot S3, and/or whether the third substrate W3 placed on the third slot S3 is seated in the given position. Based on the determined actual distance data, the reading portion 660 may determine that the third substrate W3 has deviated from the given position of the third slot S3 on the side surface of the container F. The reading portion 660 may finally determine that both the first substrate W1 and the third substrate W3 have been in the abnormal state as a result of secondly observing the first substrate W1 and the third substrate W3 determined to be in the abnormal state in the primary observation step S100 in the secondary observation step S200, and may then generate an interlock.

According to the exemplary embodiment of the present invention described above, it is possible to collectively observe the states of the substrates W accommodated in the container F using the observation unit 50 and determine whether the substrates W are in the abnormal state. Accordingly, the productivity of the substrate treatment process may be improved by quickly determining the states of the substrates W accommodated in the container F. In addition, it is possible to observe and determine in more detail whether the substrates W are damaged through the implemented image in addition to the presence or absence of substrates W accommodated in the container F and the distortion of the substrates W.

In addition, according to the exemplary embodiment of the present invention, the states of the substrates W accommodated in the container F are quickly determined using the observation unit 50 in the primary observation step S100, and the secondary observation is performed using the auxiliary observation unit 60 for each of the specific substrates W determined to be in the abnormal state in the primary observation step S100.

In the aforementioned embodiment, it has been described that both the observation unit 50 and the auxiliary observation unit 60 are mounted in the transfer unit 40, but the present invention is not limited thereto. For example, only one of the observation unit 50 and the auxiliary observation unit 60 may be mounted in the transfer unit 40.

In addition, unlike the above-described example, the secondary observation step S200 is not bound to determine the abnormal state in the primary observation step S100, and can observe and determine the states of all the substrates W seated in each of the slots S installed in the container F.

The foregoing detailed description illustrates the present invention. In addition, the above description shows and describes the exemplary embodiments of the present invention, and the present invention may be used in various other combinations, modifications, and environments. That is, changes or modifications are possible within the scope of the concept of the invention disclosed herein, the scope equivalent to the written disclosure, and/or within the scope of skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. In addition, the appended claims should be construed to include other exemplary embodiments as well.

What is claimed is:

1. An apparatus for treating a substrate, comprising:
- a first module;
- a treating module configured to treat the substrate; and
- a controller configured to control operations of the first module,
- wherein the first module includes:
  - a load port on which a container having a plurality of slots is placed, the plurality of slots configured to accommodate a plurality of substrates, the substrates including the substrate and at least one other substrate;
  - a transfer unit having a hand that transfers the substrate between the load port and the treating module; and
  - an observation unit mounted in the transfer unit and configured to simultaneously observe states of each of the substrates at a preset reference position,
- wherein the controller is configured to cause the observation unit to perform a primary observation operation at the reference position,
- wherein the primary observation operation includes the observation unit simultaneously observing the states of the substrates, and
- wherein the observation unit is configured to, during the primary observation operation,
  - collect time data on the time taken for light to be reflected and received from the substrate after irradiating the light to the substrate accommodated in the container; and
  - estimate a relative distance between the substrate accommodated in the container according to the time data and the observation unit.

2. The apparatus for treating a substrate of claim 1, wherein the observation unit is installed in an end of the hand.

3. The apparatus for treating a substrate of claim 2, wherein the observation unit is further configured to determine the state of the substrate accommodated in the container by differently matching specific colors for each distance data.

4. The apparatus for treating a substrate of claim 3, wherein the first module further includes an auxiliary observation unit configured to selectively observe the states of the substrates by irradiating a laser individually toward each of the substrates accommodated in the container,
- wherein the auxiliary observation unit observes the state of the substrate by measuring an actual distance between the substrate and the auxiliary observation unit by using the laser irradiated to the substrate accommodated in the container.

5. The apparatus for treating a substrate of claim 4, wherein the auxiliary observation unit is installed in the end of the hand.

6. The apparatus for treating a substrate of claim 5, wherein the transfer unit further includes a driver configured to drive the hand, wherein the auxiliary observation unit irradiates the laser to the substrate accommodated in the container while the hand moves vertically by the driver.

7. The apparatus for treating a substrate of claim 6, wherein the controller is further configured to control the transfer unit and the auxiliary observation unit, wherein the controller configured to control the transfer unit, the observation unit, and the auxiliary observation unit so as to primarily observe the state of the substrate accommodated in the container using the observation unit and secondarily observe the state of the substrate using the auxiliary observation unit.

8. The apparatus for treating a substrate of claim 7, wherein when the hand is moved to the reference position to primarily observe the substrate and the substrate accommodated in the container is determined to be in an abnormal state from the primary observation operation, the controller is configured to control the transfer unit, the observation unit, and/or the auxiliary observation unit such that the hand is vertically moved to secondly observe the substrate in the abnormal state.

9. An apparatus for treating a substrate, comprising:

a first module;

a treating module configured to treat the substrate, and a controller configured to control operations of the first module, wherein the first module includes:

a load port on which a container having a plurality of slots is placed, the plurality of slots configured to accommodate a plurality of substrates, the substrates including the substrate and at least one other substrate;

a transfer frame disposed between the load port and the treating module and configured to transfer the substrate;

a transfer unit disposed in the transfer frame and having a hand for transferring the substrate between the load port and the treating module;

an observation unit installed in the hand and configured to simultaneously observe states of all the substrates accommodated in the container in a state in which the hand is disposed in a preset reference position; and an auxiliary observation unit installed in the hand at a position not overlapping the observation unit and configured to irradiate a laser toward a specific substrate accommodated in the container while the hand moves vertically and selectively observe the state of the specific substrate, wherein the controller is configured to cause the observation unit to perform a primary observation operation at the reference position, wherein the primary observation operation includes the observation unit simultaneously observing the states of the substrates, and wherein the observation unit is configured to, during the primary observation operation, collect time data on the time taken for light to be reflected and received from the substrate after irradiating the light to the substrate accommodated in the container; and estimate a relative distance between the substrate accommodated in the container according to the time data and the observation unit.

10. The apparatus for treating a substrate of claim 9, wherein the observation unit is further configured to primarily determine the state of the substrate accommodated in the container by differently matching specific colors for each distance data, and the auxiliary observation unit irradiates a laser toward the specific substrate accommodated in the container, measures an actual distance between the specific substrate and the auxiliary observation unit using the irradiated laser, and secondly determines the state of the specific substrate accommodated in the container.

* * * * *